United States Patent [19]
Yang et al.

[11] Patent Number: 5,354,704
[45] Date of Patent: Oct. 11, 1994

[54] SYMMETRIC SRAM CELL WITH BURIED N+ LOCAL INTERCONNECTION LINE

[75] Inventors: Ming-Tzong Yang; Chen-Chin Hsue, both of Hsin-Chu, Taiwan

[73] Assignee: United Microelectronics Corporation, Hsin Chu, Taiwan

[21] Appl. No.: 102,978

[22] Filed: Jul. 28, 1993

[51] Int. Cl.$^5$ ............................................ H01L 21/70
[52] U.S. Cl. ........................................ 437/52; 437/26; 437/48
[58] Field of Search ............................ 437/48, 52, 26; 257/903, 904

[56] References Cited
U.S. PATENT DOCUMENTS

| | | | |
|---|---|---|---|
| 4,187,602 | 2/1980 | McElroy | 437/48 |
| 4,246,592 | 1/1981 | Bartlett | 257/904 |
| 4,506,436 | 3/1985 | Bakeman, Jr. et al. | 437/26 |
| 4,554,729 | 11/1985 | Tamimura et al. | 437/52 |
| 4,608,748 | 9/1986 | Noguchi et al. | 437/48 |
| 4,794,561 | 12/1988 | Hsu | 437/48 |
| 4,980,732 | 12/1990 | Okazawa | 357/23.5 |
| 5,155,055 | 10/1992 | Gill et al. | 437/43 |

*Primary Examiner*—Tom Thomas
*Attorney, Agent, or Firm*—George O. Saile; Graham S. Jones, Jr.

[57] ABSTRACT

A symmetrical, SRAM silicon device comprises substrate comprising a semiconductor material with, a set of buried local interconnection lines in the silicon substrate. A word line is located centrally on the surface of the device. Pull down transistors are located symmetrically one either side of the word line. Interconnections are formed in the same layer as a BN+ diffusion. There is only one wordline composed of polysilicon. The pull down transistors are located on opposite sides of the word line. The cell size is small. There is no 45° layout, and the metal rule is loose. Pass transistor source and drain regions are in the substrate juxtaposed with the buried local interconnection line. There is a layer of gate oxide above the source region and the drain region, and a gate adore the gate oxide juxtaposed with the source region and drain region.

20 Claims, 6 Drawing Sheets

SYMMETRIC SRAM CELL WITH BURIED N+ LOCAL INTERCONNECTION LINE

BACKGROUND OF THE INVENTION

1. Field of the Invention

This invention relates to SRAM cells and more particularly to word lines and interconnection lines therefor.

2. Description of Related Art

U.S. Pat. No. 4,980,732 of Okazawa "Semiconductor Device Having an Improved Thin Film Transistor" shows an SRAM with a TFT load.

U.S. Pat. No. 5,155,055 of Gill et al "Method of Making an Electrically-Erasable Electrically Programmable Read-Only Memory Cell with Self-Aligned Tunnel" describes at Col. 3, lines 36, et seq. the use of "bitlines 13 formed beneath thick thermal silicon layers 14 in the face" of the substrate in an array of EPROMs. "These buried bitlines 13 form the source region 15 and the drain region 16 for each of the cells 10." Referring to the Abstract of the patent, it states "the bitlines and source/drain regions are buried beneath relatively thick silicon oxide, which allows a favorable ratio of control gate to floating gate capacitance."

Figure 1A:
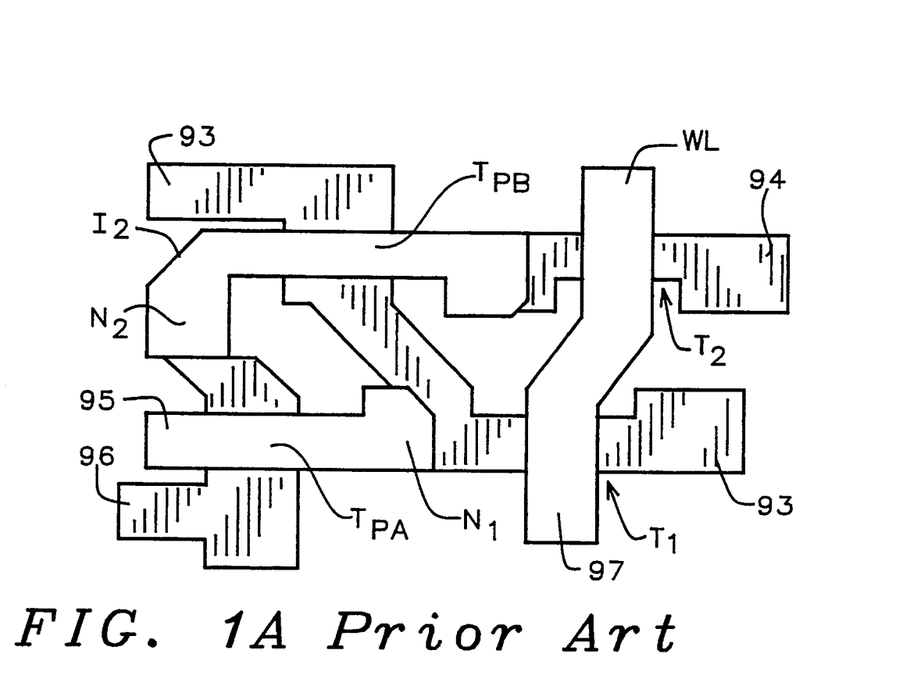
FIG. 1A is a conventional cell.
Figure 1B:
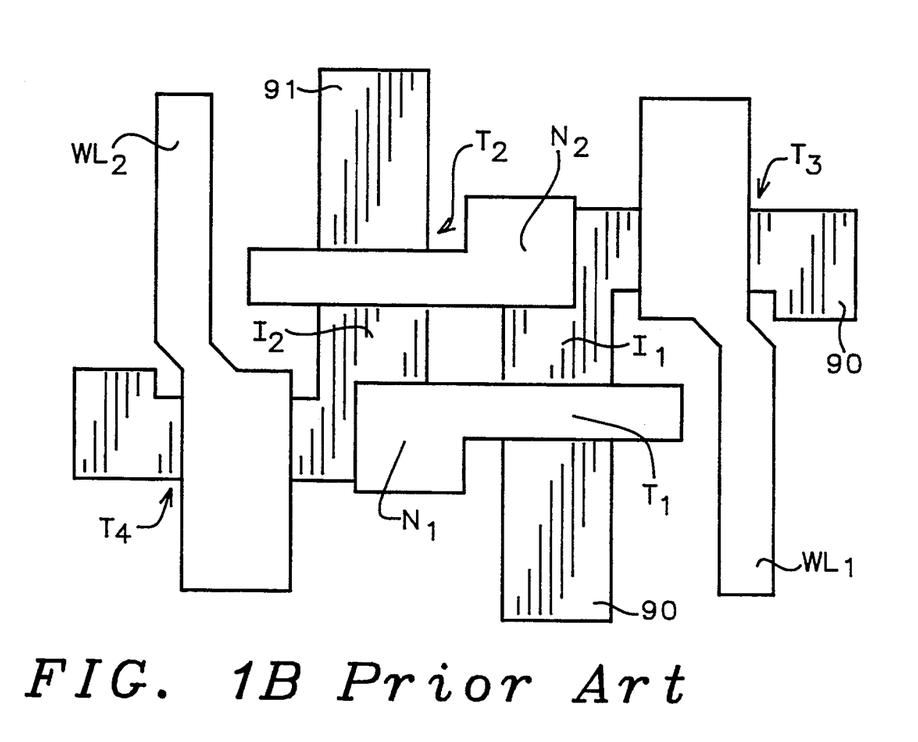
FIG. 1B is a split wordline cell.

FIGS. 1A AND 1B show two different prior art SRAM configurations which illustrate certain problems in the prior art which will be explained below.

FIG. 1A shows a conventional cell with active layer structures 93, 94 and 96, etc. on top of which polysilicon line 95, polysilicon interconnection line $I_2$ and wordline 97 have been formed. A transistor TPA is formed between active structure 96 and polysilicon line 95. A node N1 is formed between structure 93 and polysilicon line 95. Node N2 connects between structure 96 and line $I_2$. Transistor TPB lies at the intersection of line $I_2$ and structure 93. Node N1 is formed at the other end of line 95 and the intermediate section of structure 93. Transistor T1 is formed at the intersection of structure 93 and wordline 97. The portion of structure 93 between transistor TPB and transistor T1 is the interconnection line $I_1$ formed of active layer material. At the other end of wordline 97, a transistor T2 is at the intersection with structure 94.

FIG. 1B shows a split wordline cell with active layer structures 90, 91, etc. on top of which polysilicon lines N1 and N2 and wordlines WL1 and WL2 are formed. Transistor T1 is at the intersection of line N1 and structure 90. Transistor T2 is at the intersection of line N2 and structure 91. Transistor T3 is at the intersection of line WL1 and structure 90. Transistor T4 is at the intersection of structure 91 and word line WL2.

For the EPROM or ROM buried N+ is used for bit lines for long distance connections. But SRAM bit lines are always defined by metal. An object of this invention is to provide an SRAM employing a buried N+ line for local interconnection lines connected from, for example, the Junction in FIG. 2 between the drains of transistors T4 and T2 to the gate of transistor T1. It is also an object of this invention to locate the pulldown transistors T1 and T2 on opposite sides of the wordline, so local interconnection line $I_1$ and local interconnection line $I_2$ are defined by the buried N+ lines.

Heretofore, as seen in the plan views shown in FIGS. 1A and 1B, pulldown transistors such as transistor TPA and transistor TPB in FIG. 1A and transistor T1 and transistor T2 in FIG. 1B have been located on the same side of the word line. Local interconnection line $I_1$ and local interconnection line $I_2$ have been defined by two different conductors (one by N+ diffusion $I_1$, the other by polysilicon $I_2$ in FIG. 1A. FIG. 1B shows two N+ diffusion local interconnection line regions $I_1$ (diffusion 90) and $I_2$ (diffusion 91) and a buried contact, however they still need two word lines WL1 and WL2. The concept of employing the layout of the instant invention had not been contemplated in the prior art designs.

For a conventional SRAM cell (FIG. 1A) interconnection of two nodes, an N+ diffusion 93 and polysilicon $I_2$ are used. Active diffused regions and polysilicon have different resistance values so such an SRAM cell is asymmetric in the sense that the resistance of polysilicon and the N+ diffusion are different and the distances along the lines are different.

Some symmetric cells need two word lines WL1 and WL2 as in FIG. 1B. See IEDM 91-477. An object of this invention and a significant advantage of this invention is to use only one word line.

FIG. 1A shows a prior art conventional SRAM cell. The features of the cell are that the local interconnection line $I_1$ and local interconnection line $I_2$ are defined in two different layers (the first is a diffusion of an N+ diffusion and the other layer is a polysilicon deposit.) The resistor materials are different and the cell is more unstable because the resistor N1 and N2 are different, so the currents of transistor T1 and transistor T2 are different. Since the cell prefers for the higher current transistor to turn on, this cell is asymmetric.

The advantage of the conventional cell is that the cell size is small. The disadvantages are as follows:

1) that they are asymmetric with a 45° layout (resolution in SHRINK (Super High Resolution Illumination Control) or lithography or the phase shift mask is not good at 45°), and 2) the metal rule is tight.

The local interconnection line $I_1$ and local interconnection line $I_2$ are in different layers (diffusion 93 and polysilicon node N2.) (See FIG. 1A.) There is one word line WL (polysilicon.) The pull down transistor $T_{PA}$ is on the same side of the word line WL as the local interconnection lines.

FIG. 1B shows a prior art split wordline cell with wordline WL1 the local interconnection line $I_1$ and the local interconnection line $I_2$ can be defined in the same layer (diffusion) but that design requires two word lines WL1 and WL2 so the cell size is larger and timing of pass transistors T3 and T4 may not match because for the SRAM the pass gate transistors T3 and T4 must turn on at the same time for SRAM sensing in a differential amplifier to differentiate two bit lines.

The advantage of the split wordline cell is that the cell size is symmetric, and that there is no 45° layout. The disadvantages are as follows:

1) that the cell size is large, 2) the metal rule is tight and the timing does not match.

The local interconnection lines are in the same layer (diffusion) as can be seen by reference to FIG. 1B. There are two word lines WL1 and WL2 composed of polysilicon (from the first polysilicon layer,) as shown in FIG. 1B.

The pull down transistors T1 and T2 are on the same side of the word line WL1 as in the case of the conventional SRAM above.

An object of this invention is to provide an SRAM with the interconnections in the same layer, preferably formed of a buried N+ dopant.

A further object of this invention mentioned above is to provide an SRAM with one wordline, preferably formed of polysilicon.

Still another object of this invention is to provide a pull down transistor on the opposite side of the word line.

A significant object of this invention is to provide a symmetrical SRAM with a small cell size.

A further object of this invention is cell current ratio pull down transistor/pass transistor is high because the cell is not limited by this rule.

An object of this invention is to avoid a 45° layout.

An important object of this invention is to provide a loose metal rule.

SUMMARY OF THE INVENTION

An SRAM silicon device comprises a substrate, a semiconductor material, a pair of buried local interconnection lines in the silicon substrate, a word line on the surface of the device, a source region and drain region formed in the substrate Juxtaposed with the buried N+ local interconnection line, a layer of gate oxide above the source region and drain region, a gate above the gate oxide juxtaposed with the source region and drain region.

Preferably the device is symmetrical.

A comparison of the conventional, split wordline and the instant invention with the buried local interconnection line.

An SRAM silicon device in accordance with this invention comprises,
  a) a substrate comprising a semiconductor material,
  b) a pair of local interconnection lines in the silicon substrate,
  c) a word line on the surface of the device,
  d) a source region and drain region formed in the substrate Juxtaposed with the buried local interconnection line,
  e) a layer of gate oxide above the source region and drain region,
  f) a gate above the gate oxide Juxtaposed with the source region and drain region, and
  g) a pair of pull down transistors located on opposite sides of said wordline, whereby said device is symmetrical and timing is matched.

Preferably, gate oxide structures are formed on the substrate prior to formation of an N+ local interconnection line; and the buried local interconnection line is formed by ion implantation into the semiconductor substrate, and the source region and drain region were formed subsequent to the buried local interconnection line.

In another aspect of the invention, an SRAM silicon device is formed by the steps comprising
  a) forming a base oxide on a semiconductor substrate,
  b) forming a FOX structure on the surface of the base oxide and the semiconductor substrate,
  c) implanting a pair of buried local interconnection lines into the substrate,
  d) applying polysilicon and etching with a mask, and
  e) forming source region and drain region in the substrate.

Preferably, the ion implantation of the buried local interconnection line is performed with doping ions implanted in the buried layer, and the ion implantation of the buried local interconnection line is performed employing ions selected from the group consisting of arsenic (As), phosphorous (P), and antimony (Sb). It is preferred that the chemical species of the dopant implanted in the local interconnection lines is arsenic (As). The chemical species of the dopant implanted in the source region and drain region is selected from the group consisting of arsenic (As) and phosphorous (P). In each case the implantation is performed with a dose of between about 1E14 cm$^{-2}$ and about 6E16 cm$^{-2}$, at an energy of between about 20 keV and about 120 keV in a high current implanter type of tool. Preferably, the buried local interconnection line is implanted to a depth between about 500 Å and 5,000 Å.

A method in accordance with this invention for fabrication of an SRAM silicon device comprises
  a) forming a field oxide structure on the surface of a semiconductor substrate,
  b) implanting a pair of buried local interconnection lines into the substrate,
  c) forming a gate polysilicon structure on the substrate,
  d) forming a mask and etching the polysilicon to form gates, and
  e) forming source region and drain region in the substrate.

A method of fabrication of an SRAM silicon device wherein the ion implantation of the pair of buried local interconnection lines is performed employing N+ ions implanted in the buried layer with a dose of between about 1E14 cm$^{-2}$ and about 6E16 cm$^{-2}$, at an energy of between about 20 keV and about 120 keV in a high current implanter type of tool. Preferably, the chemical species of the dopant implanted in the N+ local interconnection line is arsenic. Preferably, the chemical species of the dopant implanted in the source region and the drain region is selected from the group consisting of phosphorous (P), arsenic (As) and antimony (Sb).

Another preferred aspect of the invention is that the pair of buried local interconnection lines are implanted to a depth between about 500 Å and about 5,000 Å, and optimally to a depth of between 1500 Å and 3,000 Å. Preferably the implantation into the local interconnection line comprises the arsenic species. The mask for the field oxide structure comprises silicon nitride.

BRIEF DESCRIPTION OF THE DRAWINGS

The foregoing and other aspects and advantages of this invention are explained and described below with reference to the accompanying drawings, in which:

FIGS. 1A AND 1B show prior art SRAM configurations.

DESCRIPTION OF THE PREFERRED EMBODIMENT

Figure 2:
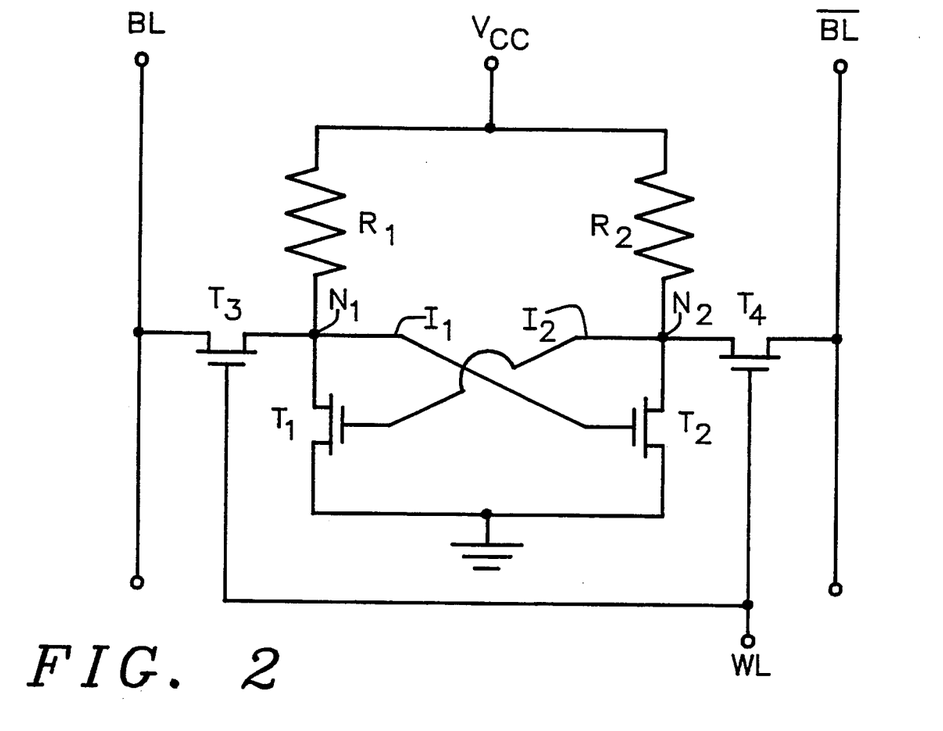
FIG. 2 shows a circuit diagram of an SRAM cell with a polysilicon load.

FIG. 2 shows a circuit diagram of an SRAM cell with a polysilicon load.

Figure 3:
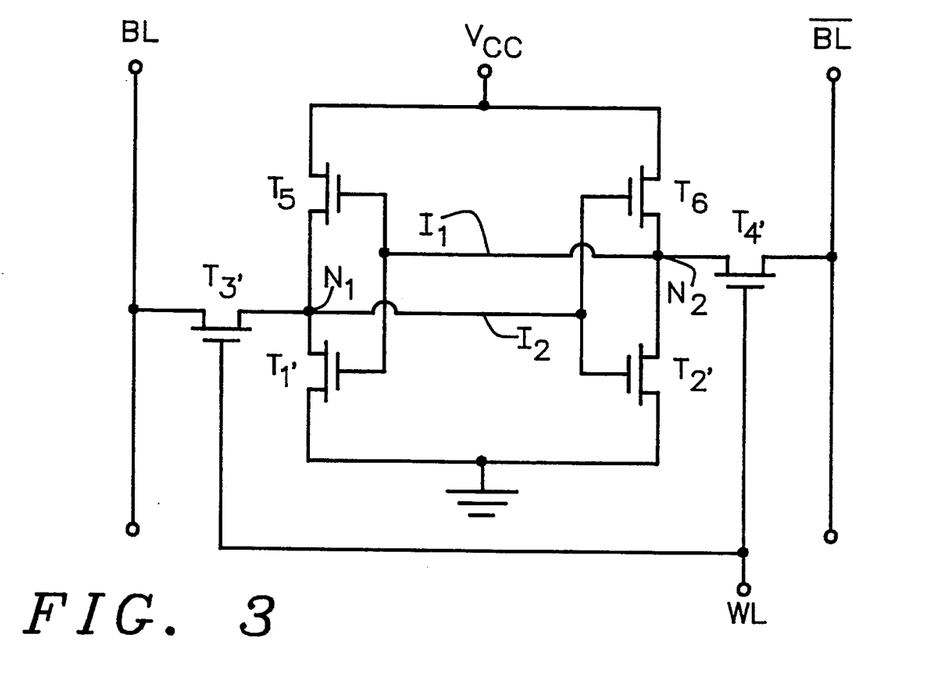
FIG. 3 shows an SRAM cell with six transistors or a thin film transistor.

FIG. 3 shows an SRAM cell with six transistors or thin film transistors.

FIGS. 2 and 3 show both a four transistor circuit (FIG. 2 with polysilicon load) and a six transistor circuit (FIG. 3 with a Thin Film Transistor (TFT)) which need a pair of local interconnection lines, i.e. local interconnection line $I_1$ and local interconnection line $I_2$, which illustrates how this invention can be employed for both four transistor cells and six transistor cells.

This invention employs buried N+ structures, which are used for the local interconnection lines in an SRAM such as that shown in FIG. 2. The buried local interconnection lines are connected between the nodes N1 and N2 and the gates of the pull down transistors T1 and T2. In particular, two buried N+ local interconnection lines are used in the SRAM. They include local interconnection line $I_1$ and local interconnection line $I_2$. As illustrated in FIG. 2, we refer to transistors such as transistor T1 and transistor T2 as "pull down" transistors, because when T1 is turned on then the node N1 voltage is pulled down to ground. Transistor T3 and transistor T4 are referred to as "pass transistors" as they "pass" the data from bit line $\overline{BL}$ to node N1 or from node N2 to the other bit line $\overline{BL}$.

Referring to FIG. 2, local interconnection line $I_1$ is used to connect the common drain of pull down transistor T1 and pass transistor T3 and the gate of pull down transistor T2. Interconnection line $I_2$ is used to connect the common drain of pull down transistor T2 and pass transistor T4 and the gate of pull down transistor T1. A single word line is connected to the gates of pass transistors T3 and T4.

Referring to FIG. 3, a circuit is shown which is similar to the circuit of FIG. 2, resistor R1 has been replaced by load transistor T5 with its gate connected to local interconnection line I1, as is the gate of transistor T1'. Resistor R2 has been replaced by load transistor T6 with its gate connected to local interconnection line $I_2$, as is the gate of transistor T1'. The buried local interconnection lines are connected between the nodes N1 and N2 and the gates of the pull down transistors T1' and T2'. Again, a single word line is connected to the gates of pass transistors T3' and T4'.

Figure 4:
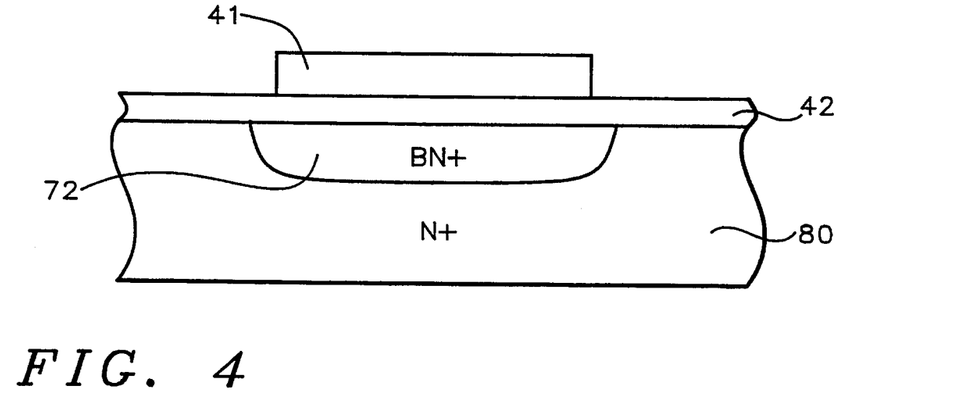
FIG. 4 shows a buried N+ local interconnection line beneath a polysilicon gate.
Figure 5:
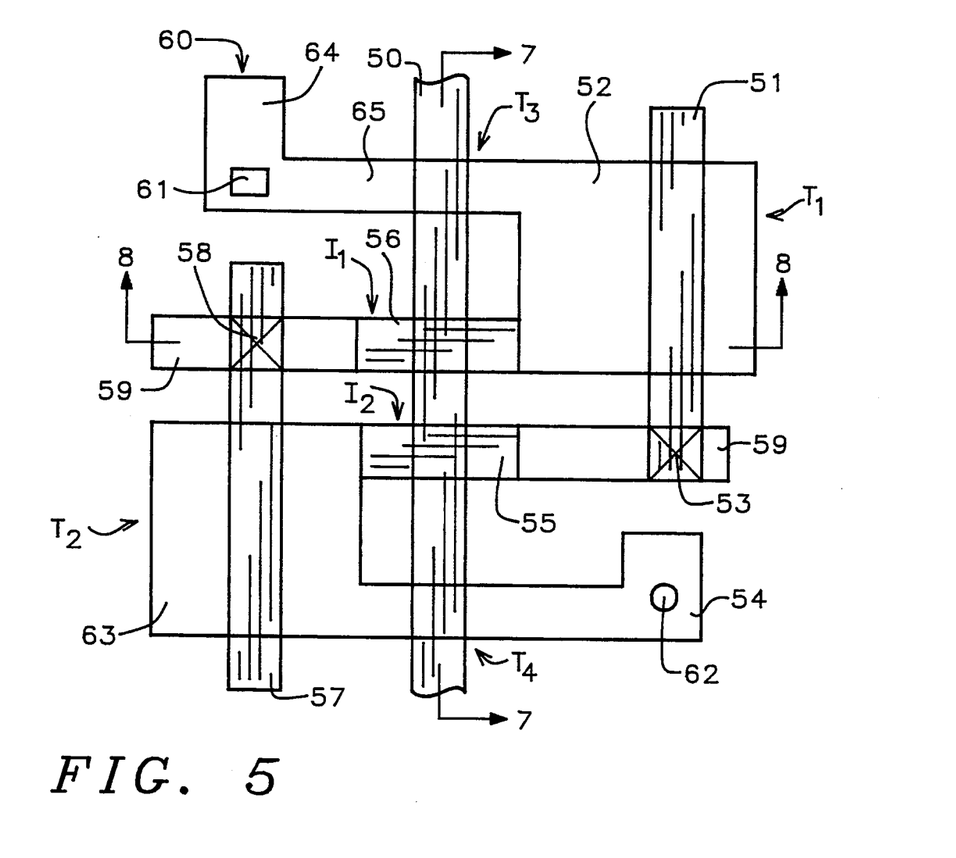
FIG. 5 shows a plan view of the configuration of the buried local interconnection lines and the balanced structure.
Figure 8:
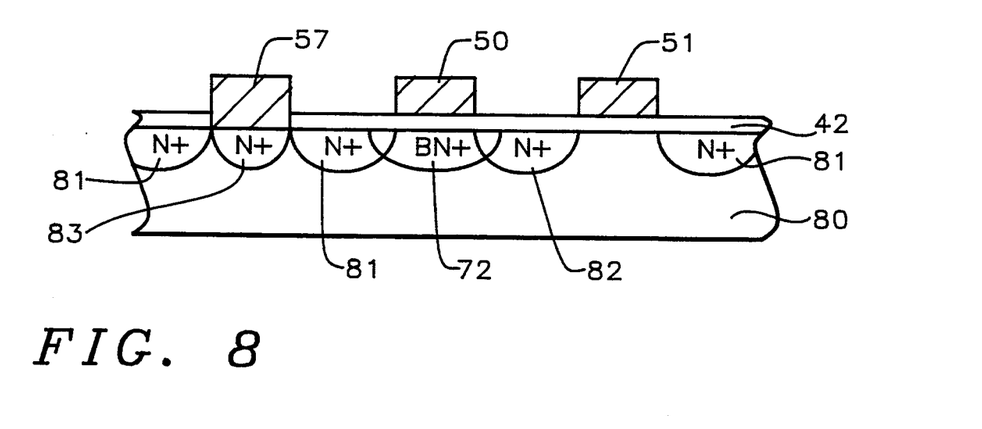
FIG. 8 illustrates the implantation of the source and drain into the product of FIGS. 7A-7C.

Referring to FIG. 4, the buried BN+ layer 72 is used for interconnection through both local interconnection lines $I_1$ and $I_2$ through the bottom of the polysilicon word line 50 in FIG. 5 and FIG. 8. FIG. 4 shows a buried N+ local interconnection line 72 beneath a polysilicon gate 41 with a gate oxide 42 in between. Base oxide 40 is used for a LOCOS process and then stripped or etched) and then the gate oxide is grown. The base oxide 40 in FIG. 6A must be stripped and regrown as gate oxide 42 in FIG. 6C.

FIG. 5 shows a top plan view of the configuration of the buried local interconnection lines and the balanced SRAM structure in accordance with this invention. Pull down transistors T1 and T2 and pass transistors T3 and T4 are illustrated as well as local interconnection line $I_1$ and local interconnection line $I_2$. A section line 7—7 shows the section line along which FIG. 7 has been taken. A section line 8—8 shows the section line along which FIG. 8 has been taken.

Referring to FIG. 5, a single wordline 50 composed of polysilicon extends from the top to the bottom of the device in the center dividing the device in half, symmetrically. Wordline 50 serves, at its upper end, as the polysilicon gate of transistor T3 a given distance from local interconnection line $I_1$ along wordline 50. Wordline 50 also serves, at its lower end, as the polysilicon gate of transistor T4, substantially an equal distance from local interconnection line $I_2$ along wordline 50. Line 51, which is also composed of polysilicon, serves as the gate of pull down transistor T1. Structure 52 is the common drain of transistors T1 and T3. Line 51 comprises the polysilicon gate of pull down transistor T1. Region 53 is the buried contact which connects the polysilicon line 51 to line 59'. Both the local interconnection line $I_1$ 56 and local interconnection line $I_2$ 55 are shown. Local interconnection line $I_1$ 56 is an N+ line, buried in the substrate 80. Local interconnection line $I_2$ 55 is also an N+ line buried in the substrate 80, parallel to line 56 and of the same length. The gate line 57 of pull down transistor T2 is connected via the buried contact 58 to connection diffusion area 59. Connection diffusion area 59 connects buried contact 58 and local interconnection line $I_1$ 56. Connection diffusion area 59' connects buried contact 53 and local interconnection line $I_2$ 55. A contact 61 serves as the contact for bit line 1. Region 60 is an N+ diffusion area for opening contact 61 to bit line 1. A contact 62 serves as the contact for bit line 2. Region 54 is an N+ diffusion area for opening contact 62 to bit line 2. Element 63 is connected to voltage source Vss to power the source of transistor T2. Areas 64 and 65 are portions of the N+ diffusion 60.

Figure 6A:
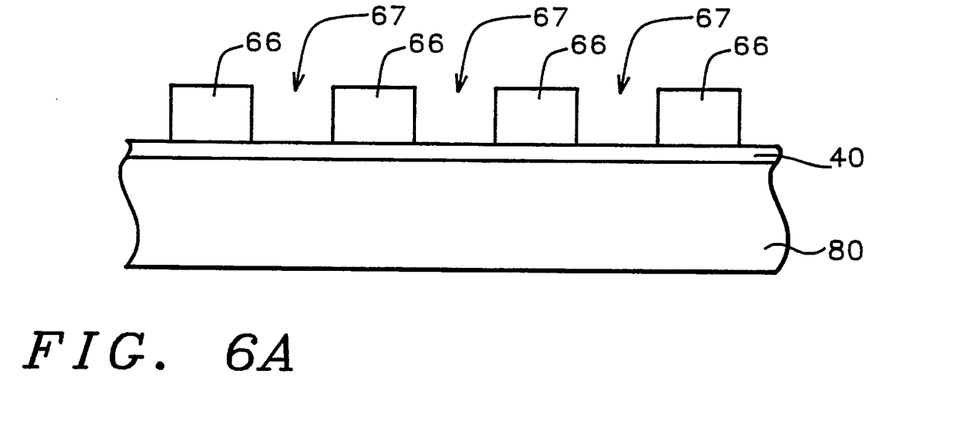
FIGS. 6A–6C shows the process for forming the field oxide structure forming the gate oxide.
Figure 6B:
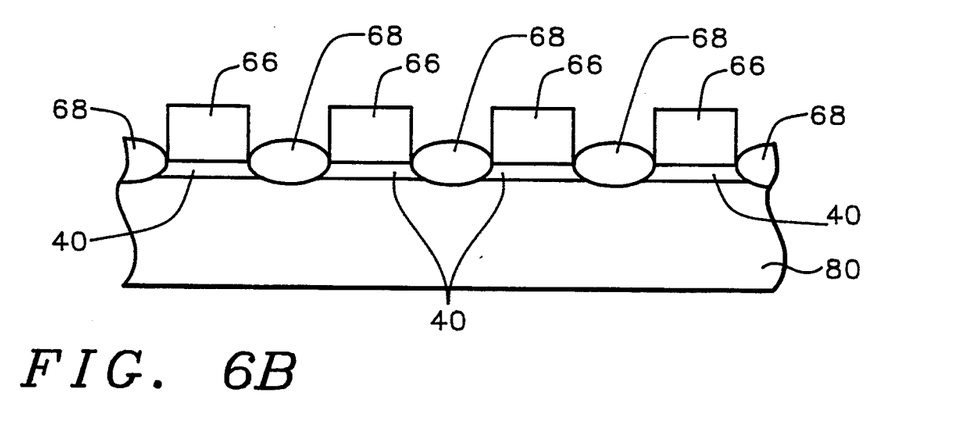
Figure 6C:
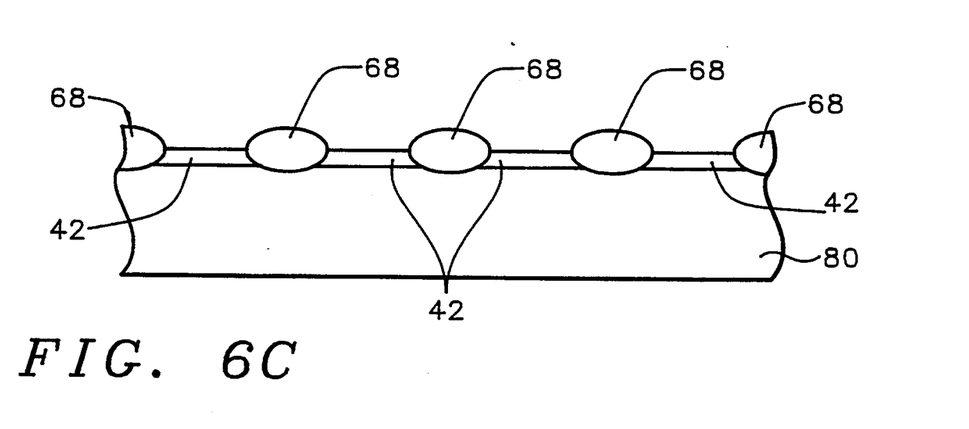

FIGS. 6A-6C show the process for forming the field oxide (FOX) structure 68 and forming the gate oxide 42. FIG. 6A shows a substrate 80 with a base oxide 40 formed on the surface of the substrate 80 composed of doped silicon. A developed mask is shown formed first by deposition of a continuous, blanket silicon nitride ($Si_3N_4$) layer 66 on base oxide 40. Following deposition of layer 66 a process of patterning the $Si_3N_4$ layer 66 is performed. The lithographic process commences by spinning photoresist (not shown) onto the layer 66, exposing the photoresist to a master pattern and development of the pattern to form a mask on top of the $Si_3N_4$ layer 66. Next the $Si_3N_4$ layer 66 is etched to form openings 67 therethrough. The layer 66 is etched to form the mask 66, as shown in FIG. 6A exposing the surface of gate oxide 40 on substrate 80 through the openings 67. The process of etching the $Si_3N_4$ layer 66 is preferably performed with a dry process in an etchant gas selected from the group consisting of $CCl_4$ gas and $Cl_2$, at a temperature of about room temperature in a plasma chamber employing an anisotropic etching process as is well known by those skilled in the art.

While a dry etch is preferred, a wet chemical etch can be employed as an alternative.

A LOCOS process is employed on the exposed base oxide 40 to form a pattern of field oxide (FOX) structures 68 between the mask segments 66. LOCOS is employed because oxygen is very difficult to diffuse through $Si_3N_4$, so we grow the field oxide in a furnace. The oxide is grown only in those areas which are not protected by a $Si_3N_4$ mask.

Next, the $Si_3N_4$ mask 66 is removed by a wet process of $Si_3N_4$ stripping in $H_2PO_4$ at a temperature between about 100° C. and about 200° C., exposing the remaining base oxide 40. Next, the remaining base oxide 40 is removed by HF or BOE. Next the gate oxide 42 is grown in place of the base oxide 40 Just removed, between the FOX structures 68.

Figure 7A:
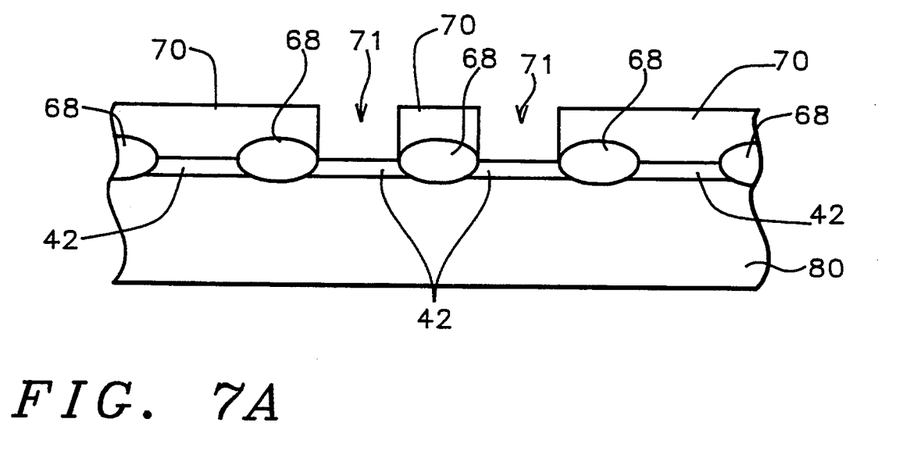
FIGS. 7A–7C illustrate the process of forming the local interconnection line implantation onto the product of FIGS. 6A-6C, and the formation of the gate polysilicon structure.
Figure 7B:
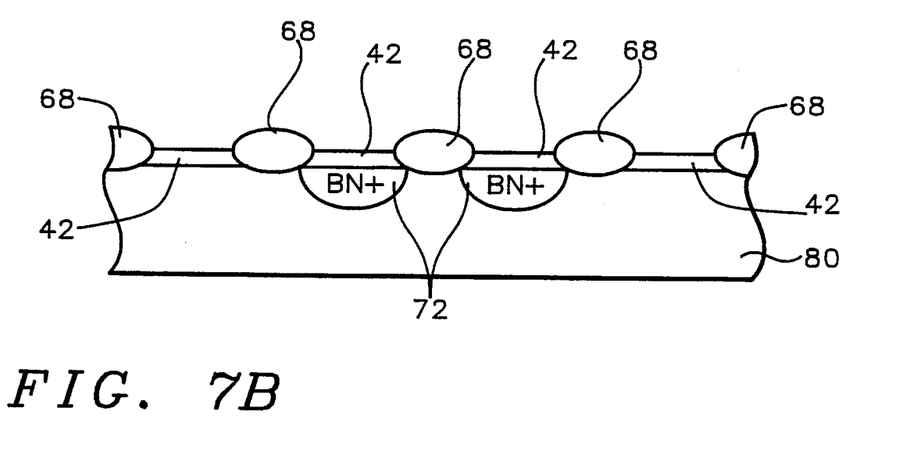
Figure 7C:
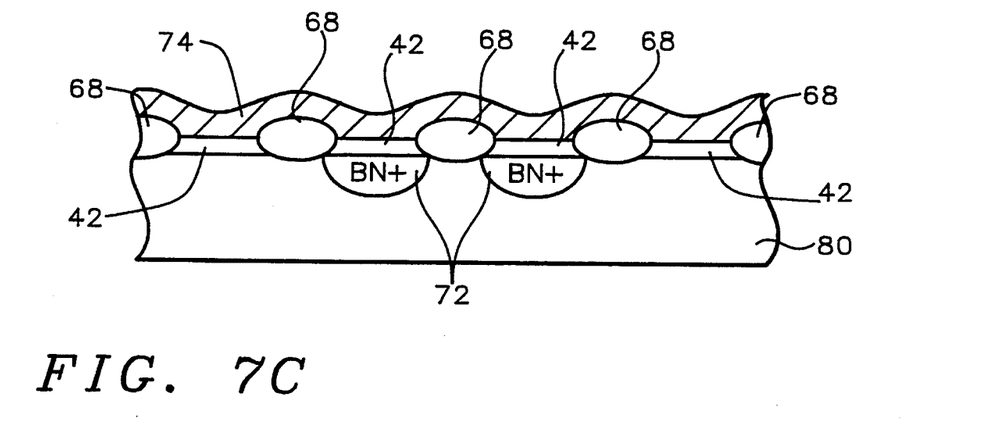

FIGS. 7A-7C illustrate the process of forming the local interconnection line implantation, and the formation of the gate polysilicon structure.

Referring to FIG. 7A, the work product of the process of FIG. 6C is ready for masking to define where the implantation of buried N+ local interconnection lines 72 into substrate 80 is to be performed. The lithographic process commences by spinning photoresist 70 on top of substrate 80, where it is exposed and over the FOX structures 68. Next the photoresist is exposed to a master pattern and the pattern is developed to form a mask.

In the next step, as shown in FIG. 7B, buried N+ ions are implanted into local interconnection line regions 72 in the substrate 80 through openings 71 (where the photoresist 70 does not provide a shield. ) The chemical species of the dopant implanted is arsenic (As) with a dose within an operable range of between about $1E14$ cm$^{-2}$ and about $6E16$ cm$^{-2}$ at an energy of between about 20 keV and about 120 keV in a high current implanter type of tool. The optimum dosages comprises a range of between about $1E15$ cm$^{-2}$ and about $5E15$ cm$^{-2}$.

Referring to FIG. 7C, after the implantation step in FIG. 7B, polysilicon 74 is deposited by LPCVD (Low Pressure CVD) for the purpose of patterning wordlines, gates and all transistors. The polysilicon is deposited to a thickness of between about 1000 Å and about 6000 Å from a source of silicon comprising silane.

Still referring to FIG. 7C, the polysilicon 74 is now ready for masking to define a polysilicon structure as shown in FIG. 8. The structures to be formed as shown in FIG. 8 include wordline 50 (which also provides the gates of pass through transistors T3 and T4), and gate line 51 (for pull down transistor T1) and gate 57 (for pull down transistor T2) by subsequent etching. The lithographic process commences by spinning photoresist (not shown) on top of polysilicon 74. Next the photoresist is exposed to a master pattern and the pattern is developed to form a mask.

Next the polysilicon layer 74 is etched to form openings 67 therethrough. The layer 74 is etched to form a mask exposing areas required to define wordlines, the gates of the pull down transistors and all transistors through the polysilicon defining mask. The process of anisotropic etching the polysilicon through the mask is performed with a dry process in a gas selected from the group consisting of Cl$_2$, HBr, CF$_4$, and SF$_6$ gases, at a temperature on the order of room temperature in a plasma chamber or the like chamber.

While a dry etch is preferred, a wet chemical etch can be employed as an alternative.

Referring to FIG. 8, the implantation of the source and the drain is illustrated. The source region 81 and drain 82 regions are defined by means of a lithographic mask. Region 72 is doped by a buried N+ implant step before polysilicon region 83 is out diffused from doped polysilicon line 57, after the polysilicon is doped. In FIG. 8, region 72, source region 81, drain region 82, and region 83 are all doped N+. Source region 81 and drain region 82 are doped N+ by a source drain implant after the polysilicon pattern is defined by out doping from the structures formed from the polysilicon layer 57 into the substrate region 83 below. Polysilicon line 57 remains a contact to region 83.

Note that PMOS is employed in the peripheral circuits in accordance with conventional practice.

The unmasked areas are implanted. First a photoresist mask is formed above gate oxide layer 42 extending, as well, over the polysilicon gate structures 74 and the FOX structures 68 of FIG. 7C. The surface of the gate oxide layer 42 and substrate 80 are masked in the conventional manner. Next N+ ions are implanted into the source and drain regions, such as the source region 81 and the drain region 82. The chemical species of the dopant implanted is arsenic (As)S with a dose of between about $1E14$ cm$^{-2}$ and about $5E16$ cm$^{-2}$, an energy of between about 20 keV and about 120 keV in a high current implanter type of tool. At the end of the ion implantation, the photoresist is removed by the conventional process of photoresist stripping in a dry plasma with O$_2$ or H$_2$SO$_4$ plus H$_2$O$_2$.

| | Conventional, Split Wordline and Buried N+ Devices Compared | | |
|---|---|---|---|
| | Conventional | Split Wordline | Buried N+ Interconnection |
| Inter-connection | Different layer diffusion & polysilicon | Same layer diffusion | Same layer BN+ |
| Wordline | 1 word line polysilicon | 2 word lines polysilicon | 1 word line polysilicon |
| Pull down transistor Advantages | Same side of word line | Same side of word line | Opposite sides of word line |
| | — | Symmetric | Symmetric |
| | Cell size small | — | Cell size small |
| | — | No 45° layout | No 45° layout |
| | — | — | Metal rule is loose |
| Disadvantages | Asymmetric 45° layout | — | — |
| | Metal rule is tight | Metal rule is tight | — |
| | — | timing does not match | — |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabrication of a static random access memory device comprising
   a) forming a field oxide structure and a gate oxide layer on the surface of a silicon semiconductor substrate,
   b) forming a mask with openings therethrough and ion implanting a first dopant to form a pair of buried local interconnection lines through said gate oxide layer into said substrate buried below the surface of said semiconductor substrate through said openings in said mask, c) forming a blanket polysilicon structure on said substrate,
d) forming a mask and etching said polysilicon to form at least one word line and gate electrodes of a first and second pull down transistors, and
e) forming a source region and a drain region in said substrate juxtaposed with a said buried local interconnection line by ion implanting a second dopant into said source region and into said drain region using said word line and said gate electrodes as a mask.

2. A method in accordance with claim 1 wherein the chemical species of said first dopant implanted in said local interconnection line is arsenic (As) with a dose of between approximately 1E14 cm$^{-2}$ and approximately 6E16 cm$^{-2}$, at an energy of between approximately 20 keV and approximately 120 key in a high current implanter tool.

3. A method of fabrication of a static random access memory device in accordance with claim 1 wherein said ion implantation of said buried local interconnection line is performed employing N+ ions implanted in the said substrate with a dose of between approximately 1E14 cm$^{-2}$ and approximately 6E16 cm$^{-2}$ at an energy of between approximately 20 keV and approximately 120 keV in a high current implanter tool, employing ions selected from the group consisting of phosphorous, arsenic and antimony.

4. A method of fabrication of a static random access memory device in accordance with claim 2 wherein said second dopant implanted in said source region and said drain region is selected from the group consisting of arsenic (As) and phosphorous (P), with a dose of between approximately 1E14 cm" and approximately 6E16 cm$^{-2}$, at an energy of between approximately 20 keV and approximately 120 keV in a high current implanter tool.

5. A method of fabrication of a static random access memory device in accordance with claim 1 wherein said buried local interconnection line is implanted to a depth between approximately 500 Å and approximately 5,000 Å buried below the surface of said semiconductor substrate.

6. A method of fabrication of a static random access memory device in accordance with claim 1 wherein said buried local interconnection line is implanted to a depth of between 1500 Å and 3,000 Å buried below the surface of said semiconductor substrate.

7. A method of fabrication of a static random access memory device in accordance with claim 4 wherein said buried local interconnection line is implanted to a depth between approximately 500 Å and approximately 5,000 Å buried below the surface of said semiconductor substrate.

8. A method of fabrication of a static random access memory device in accordance with claim 7 wherein said buried local interconnection line is implanted to a depth of between 1500 Å and 3,000 Å buried below the surface of said semiconductor substrate.

9. A method of fabrication of a static random access memory device in accordance with claim 1 wherein all of said implantations comprise the arsenic species.

10. A method of fabrication of a static random access memory device in accordance with claim 1 wherein the mask for said field oxide structure comprises silicon nitride.

11. A method of fabrication of a static random access memory device including a silicon semiconductor substrate with a base silicon dioxide layer formed on the surface thereof comprising
   a) forming a mask by deposition of a continuous blanket silicon nitride layer on said base silicon dioxide layer, and forming a photoresist mask on said silicon nitride layer, etching said silicon nitride layer through said photoresist mask, and then forming field oxide structures on the surface of a semiconductor substrate, and then removing the silicon nitride mask, and growing a gate oxide layer on said substrate between said field oxide structures,
   b) forming a mask with openings therethrough and ion implanting a pair of buried local interconnection lines through said gate oxide layer into said substrate through said openings in said mask buried beneath the surface of said semiconductor substrate to a depth of greater than or equal to 500 Å,
   c) forming a blanket polysilicon structure on said substrate,
   d) forming a mask and etching said polysilicon to form at least one polysilicon line above a said buried local interconnection line in said substrate and gate electrodes of a first and second pull down transistors, and
   e) forming a source region and a drain region in said substrate Juxtaposed with a said buried local interconnection line by ion implanting into said source region and said drain region using said word line and said gate electrodes as a mask.

12. A method of fabrication of a static random access memory device in accordance with claim 11 wherein one of said buried local interconnection lines lies beneath said word line.

13. A method in accordance with claim 11 wherein said first dopant implanted in said buried interconnection line is arsenic (As) with a dose of between approximately 1E14 cm$^{-2}$ and approximately 6E16 cm$^{-2}$, at an energy of between approximately 20 keV and approximately 120 keV in a high current implanter tool.

14. A method of fabrication of a static random access memory device in accordance with claim 11 wherein said ion implantation of said buried local interconnection line is performed employing N+ ions implanted in said substrate with a dose of between approximately 1E14 cm$^{-2}$ and approximately 6E16 cm$^{-2}$, at an energy of between approximately 20 keV and approximately 120 keV in a high current implanter tool, employing ions selected from the group consisting of phosphorous, arsenic and antimony.

15. A method of fabrication of a static random access memory device in accordance with claim 12 wherein said second dopant implanted in said source region and said drain region is selected from the group consisting of arsenic (As) and phosphorous (P), with a dose of between approximately 1E14 cm$^{-2}$ and approximately 5E16 cm$^{-2}$, at an energy of between approximately 20 keV and approximately 120 keV in a high current implanter tool.

16. A method of fabrication of a static random access memory device in accordance with claim 11 wherein said buried local interconnection line is implanted to a depth between approximately 500 Å and approximately 5,000 Å buried below the surface of said semiconductor substrate.

17. A method of fabrication of a static random access memory device in accordance with claim 11 wherein said buried local interconnection line is implanted to a depth of between 1500 Å and 3,000 Å buried below the surface of said semiconductor substrate.

18. A method of fabrication of a static random access memory device in accordance with claim 14 wherein said buried local interconnection line is implanted to a depth between approximately 500 Å and approximately 5,000 Å buried below the surface of said semiconductor substrate.

19. A method of fabrication of a static random access memory device in accordance with claim 17 wherein said buried local interconnection line is implanted to a depth of between 1500 Å and 3,000 Å buried below the surface of said semiconductor substrate.

20. A method of fabrication of a static random access memory device in accordance with claim 11 wherein all of said implantations comprise the arsenic species.

* * * * *